United States Patent
Staerzl

(10) Patent No.: US 7,064,459 B1
(45) Date of Patent: Jun. 20, 2006

(54) METHOD OF INHIBITING CORROSION OF A COMPONENT OF A MARINE VESSEL

(75) Inventor: Richard E. Staerzl, Fond du Lac, WI (US)

(73) Assignee: Brunswick Corporation, Lake Forest, IL (US)

( * ) Notice: Subject to any disclaimer, the term of this patent is extended or adjusted under 35 U.S.C. 154(b) by 525 days.

(21) Appl. No.: 10/271,702

(22) Filed: Oct. 15, 2002

Related U.S. Application Data

(63) Continuation-in-part of application No. 09/933,440, filed on Aug. 20, 2001, now Pat. No. 6,559,660.

(51) Int. Cl.
*H01B 7/28* (2006.01)

(52) U.S. Cl. ......................................... 307/95
(58) Field of Classification Search .................. 307/95
See application file for complete search history.

(56) References Cited

U.S. PATENT DOCUMENTS

| | | | | |
|---|---|---|---|---|
| 2,483,397 A | * | 10/1949 | Bonner | 204/196.02 |
| 3,636,409 A | * | 1/1972 | Stephens et al. | 361/43 |
| 3,769,926 A | | 11/1973 | Race | 114/0.5 |
| 3,929,606 A | | 12/1975 | Wood | 204/196 |
| 3,930,977 A | | 1/1976 | Wood | 204/196 |
| 3,953,742 A | | 4/1976 | Anderson et al. | 307/95 |
| 4,089,767 A | * | 5/1978 | Sabins | 204/196.07 |
| 4,492,877 A | | 1/1985 | Staerzl | 307/95 |
| 4,528,460 A | * | 7/1985 | Staerzl | 204/196.03 |
| 4,544,465 A | | 10/1985 | Marsh | 204/148 |
| 4,549,949 A | | 10/1985 | Guinn | 204/197 |
| 5,011,583 A | | 4/1991 | Tanbara | 204/148 |
| 5,032,095 A | | 7/1991 | Ferguson et al. | 440/89 |
| 5,298,794 A | | 3/1994 | Kuragaki | 307/95 |
| 5,627,414 A | * | 5/1997 | Brown et al. | 205/726 |
| 5,747,892 A | | 5/1998 | Staerzl | 307/95 |
| 5,748,008 A | | 5/1998 | Landreth | 324/763 |
| 5,840,164 A | | 11/1998 | Staerzl | 204/196 |
| 6,183,625 B1 | | 2/2001 | Staerzl | 205/727 |
| 6,224,742 B1 | * | 5/2001 | Doniguian | 205/724 |
| 6,265,879 B1 | | 7/2001 | Landreth | 324/537 |

* cited by examiner

*Primary Examiner*—Brian Sircus
*Assistant Examiner*—Dru Parries
(74) *Attorney, Agent, or Firm*—William D. Lanyi

(57) ABSTRACT

A method for inhibiting galvanic corrosion of marine propulsion components impresses an electronic current into the protected component and causes the protected component to act as a cathode in a galvanic circuit which comprises a conductor, such as a ground wire connected between the protected component and an electrical conductor which is external to the marine vessel on which the protective component is attached. The electrical conductor can be a ground wire of an electrical power cable connected between the marine vessel and the shore ground. The sea bed is caused to act as an anode in the galvanic circuit, with varying voltage potentials existing within the water between the sea bed and the protected component. The system can be a closed loop control circuit using a voltage sensed by an electrode, or an open loop circuit that provides current pulses based on empirical data.

19 Claims, 12 Drawing Sheets

METHOD OF INHIBITING CORROSION OF A COMPONENT OF A MARINE VESSEL

RELATED PATENT APPLICATIONS

The present patent application is a continuation-in-part of U.S. patent application Ser. No. 09/933,440, which was filed on Aug. 20, 2001 now U.S. Pat. No. 6,559,660.

BACKGROUND OF THE INVENTION

1. Field of the Invention

The present invention is generally related to a method for inhibiting corrosion of a component of a marine vessel and, more particularly, to a method for inhibiting galvanic corrosion of a marine propulsion device of a marine vessel.

2. Description of the Prior Art

It is well known to those skilled in the art of marine vessels and marine propulsions systems that galvanic corrosion can be exacerbated by connecting the marine vessel to a shore power system without appropriate protection. Several types of cathodic protection devices are commercial available. One such type of device is available in commercial quantities from the Mercury Marine division of the Brunswick Corporation and is referred as a mercathode system. As is also well known to those skilled in the art, faulty components in the electrical system of a marine vessel or its cathodic protection device can result in either galvanic corrosion or a dangerous condition.

U.S. Pat. No. 4,528,460, which issued to Staerzl on Jul. 9, 1985, discloses a cathodic protection controller. A control system for cathodically protecting an outboard drive unit from corrosion includes an anode and a reference electrode mounted on the drive unit. Current supplied to the anode is controlled by a transistor, which in turn is controlled by an amplifier. The amplifier is biased to maintain a relatively constant potential on the drive unit when operated in either fresh or salt water.

U.S. Pat. No. 6,265,879, which issued to Landreth on Jul. 24, 2001, describes an electrical integrity test system for boats. The system provides circuitry for evaluating the integrity of the boats galvanic isolator. The integrity test system includes two single reference diodes and a circuit for applying DC voltage across the reference diodes and the galvanic isolator. Another micro-controller stores the values of the voltage drops across the galvanic isolator and the voltage drops across each reference diode and subsequently determines if the voltage drop across the galvanic isolator is that to be normally expected. If it is not, then the system informs the operator that the boat's galvanic isolator is not operating properly.

U.S. Pat. No. 5,627,414, which issued to Brown et al on May 6, 1997, describes an automatic marine cathodic protection system using galvanic anodes. An automatic system uses sacrificial galvanic anodes to provide a controlled and optimum amount of cathodic protection against galvanic corrosion on submerged metal parts. Intermittently pulsed control circuitry enables an electromechanical servo system to control a resistive element interposed between the sacrificial anodes and the electrically bonded underwater parts. In an active mode of operation a current is applied directly to the anodes to quickly establish the proper level of correction which is maintained during the passive mode. Incremental corrections are made over a period of time to provide stabilization of the protection and to conserve power. A visual indication of the amount of protection is available at all times. Circuitry and indicating devices are included which facilitate location and correction of potentially harmful stray currents and to prevent loss of sacrificial anodes to nearby marine structures.

U.S. Pat. No. 4,544,465, which issued to March on Oct. 1, 1985, describes a galvanic anodes for submergible ferrous metal structures. The invention provides a detachable sacrificial anode unit comprising a rigid core, (e.g. a tubular steel member) and a body of sacrificial anode material (e.g. metals and alloys including zinc, aluminum and magnesium) surrounding and supported by the rigid core, wherein the ends of the rigid core extend beyond the ends of the body of sacrificial anode material and are adapted to be coupled to the end of another sacrificial anode unit to provide a rigid string. This invention also provides a submergible ferrous metal structure useful in a salt water environment and having a system to provide galvanic protection to the ferrous metal which system comprises a vertical oriented, rigid string of such sacrificial anode units secured to each other by threaded couplings and electrically connected to the ends thereof to such structure in a manner to provide galvanic protection to the structure.

U.S. Pat. No. 3,930,977, which issued to Wood on Jan. 6, 1976, describes a protection system for equipment and metallic fittings of non-metallic hulls of power boats. The system for protecting the personnel and the electrical equipment of power boats having non-metallic hulls and for the cathodic protection of the hulls of the metal fittings of such boats when docked and supplied from a shore-based alternating current supply, in which circuit breakers are inserted in the hot leg and the neutral leg of the shore-based alternating current supply is disclosed. It includes a polarity alarm and a polarity light socket in which is inserted a polarity light tester as described in U.S. Pat. No. 3,383,588, and in which the negative lead of the battery ground, the equipment ground, and the neutral leg of the shore-based alternating current supply are connected electrically with both the ground plate and the bonding ground of the boat.

U.S. Pat. No. 3,929,606, which issued to Wood on Dec. 30, 1975, describes a protection system for the metallic fittings non-metallic hulls of power boats. The system is intended for the cathodic protection of the metallic fittings of non-metallic hulls of power boats when such boats are docked and electrical power is supplied from a shore-based 110 volt alternating current supply. Novel circuitry, in which a battery charger is used to maintain all banks of storage batteries in operating condition, is combined with a flexible switching arrangement permitting the testing and charging of each bank of batteries, together or separately, and in which the negative leads of the battery charger, the banks of batteries, the equipment ground and the neutral leg of the shore-based alternating current supply are electrically connected with both the ground plate and the ship's bonding ground of the boat to lessen or eliminate electrolysis.

U.S. Pat. No. 3,769,521, which issued to Caldwell et al on Oct. 30, 1973, describes an impressed current cathodic protection system. The system is intended for use with a marine structure and includes an elongated supporting member which can be lowered into position adjacent the underwater structure to be protected, an underwater power supply mounted in the supporting member for converting high voltage alternating current from a source above the water's surface to low voltage direct current, one or more anodes mounted on the supporting member near the power supply, a potential controller for regulating the level of protection provided, and a reference cell for monitoring the system.

U.S. Pat. No. 3,636,409, which issued to Stephens, Jr. et al on Jan. 18, 1972, describes an electrical ground filter means for boats supplied with a shore-based source of alternating current power. An electrical ground filter means for boats or other vessels supplied with shore-based source of alternating current power has current leads and an electrical grounding lead connected between the alternating current source and a boat. The ground filter means comprises a first pair of rectifiers in series with each other, a second pair of rectifiers in series with each other and of opposite polarity with the first pair, a capacitor means, the first and second pairs of rectifiers and a capacitor means being connected electrically and parallel with each other.

U.S. Pat. No. 4,549,949, which issued to Guinn on Oct. 29, 1985, describes a marine propulsion device including cathodic protection. The marine propulsion device lower unit includes a housing having a lower portion submerged in water and defining an internal passage communicating with the water. Corrosion protection for both internal and external parts of the lower unit is provided with a sacrificial, galvanic type anode mounted on the submerged portion of the housing and including a first or outer portion having a surface exposed to water exterior to the lower unit and a second or inner portion having a surface exposed to water present in the passageway.

U.S. Pat. No. 5,011,583, which issued to Tanbara on Apr. 30, 1991, describes a corrosion prevention system for a marine propulsion system. A marine propulsion system of the type having a sacrificial anode for corrosion protection of the casing includes structure whereby the propeller is electrically insulated from the casing and the sacrificial anode. The structure includes spacers made of insulating materials, spacers having insulating coatings, or insulating coatings on the surfaces of the propeller or the propeller shaft. Electrical insulation of the propeller prevents unsightly and efficiency-reducing depositions on propeller surfaces and reduces the required size of the anode.

U.S. Pat. No. 3,953,742, which issued to Anderson et al on Apr. 27, 1976, discloses a cathodic protection monitoring apparatus for a marine propulsion device. A cathodic protection system monitor is coupled to an impressed current cathodic protection circuit used for corrosion protection of a submerged marine drive. The cathodic protection circuit includes one or more anodes and reference electrode mounted below the water line and connected to an automatic controller for supplying an anode current which is regulated in order to maintain a predetermined reference potential on the protected structure. A switch selectively connects a light emitting diode lamp or other light source between the controller output and ground so that the controller current may, when tested, be used to operate the light source in order to confirm that power is available to the anode.

U.S. Pat. No. 3,769,926, which issued to Race on Nov. 6, 1973, describes a marine galvanic control circuit. Apparatus is provided for minimizing galvanic deterioration of the metallic hull of a ship moored at a dock of a dissimilar metal, and receiving electrical power from a power source grounded to the dock, including a plurality of silicon diodes connected to an electrical power conductor grounded at the dock and at the metallic hull of the ship. The intrinsic junction voltage drop of the diodes is sufficient to block current flow due to the voltaic cell effect between the ship's hull and the dock.

U.S. Pat. No. 5,748,008, which issued to Landreth on May 5, 1998, describes an electrical integrity-test system for boats. An electrical integrity test system for boats provides circuitry for evaluating the integrity of the boat's electrical distribution AC grounding system when the boat is connected to a dock's electrical distribution system, and the integrity of the boat's galvanic isolator. The electrical integrity test system also includes a polarity detecting circuit that will activate an alarm when it detects a dock's hot and neutral conductors to be reversed. Additionally, the electrical integrity test system includes an AC ground current detecting circuit that continuously monitors the boat's AC grounding conductor for the presence of AC current. A system controller controls selected functions and sequence of functions of the described circuits. If the test system detects the AC grounding system or the boat's galvanic isolator is faulty or the dock's hot and neutral conductors are reversed or AC current flowing in the boat's AC grounding conductor, it will activate an alarm to apprise the boat operator of the faulty condition.

U.S. Pat. No. 3,953,742, which issued to Anderson et al on Apr. 27, 1976, discloses a cathodic protection monitoring apparatus for a marine propulsion device. A cathodic protection system monitor is coupled to an impressed current cathodic protection circuit used for corrosion protection of a submerged marine drive. The cathodic protection circuit includes one or more anodes and a reference electrode mounted below the water line and connected to an automatic controller for supplying an anode current which is regulated in order to maintain a predetermined reference potential on the protected structure. A switch selectively connects a light emitting diode (LED) lamp or other light source between the controller output and ground so that the controller current may, when tested, be used to operate the light source in order to confirm that power is available to the anode.

U.S. Pat. No. 4,492,877, which issued to Staerzl on Jan. 8, 1985, discloses an electrode apparatus for cathodic protection. An electrode apparatus includes an insulating housing on which the anode and reference electrode are mounted and a copper shield mounted between the anode and electrode to allow them to be mounted in close proximity to each other. The shield is electrically connected to the device to be protected and serves to match the electrical field potential at the reference electrode to that of a point on the outboard drive unit remote from the housing.

U.S. Pat. No. 5,747,892, which issued to Staerzl on May 5, 1998, discloses a galvanic isolator fault monitor. A system and method for testing and monitoring the operation of a galvanic isolator is disclosed and illustrated. The galvanic isolator is positioned between the shore ground and boat ground to prevent the flow of destructive galvanic currents between the shore ground and the boat ground. The monitoring system transmits a test current through the galvanic isolator at specific time intervals to test the effectiveness of the galvanic isolator. The monitoring system includes a first counter that outputs an enabling signal after a desired period of time. The enabling signal allows a test current to flow through the galvanic isolator for a brief period of time. The enabling signal allows a test current to flow through the galvanic isolator for a brief period of time determined by a second counter. As the test current flows through the galvanic isolator, a current sensing circuit measures the test current and activates an alarm if the test current flowing through the galvanic isolator falls outside a predetermined range. In this manner, the monitoring system monitors and periodically tests a galvanic isolator.

U.S. Pat. No. 5,840,164, which issued to Staerzl on Nov. 24, 1998, discloses a galvanic isolator. The isolator protects against galvanic corrosion of a submersible metal marine drive. The galvanic isolator is positioned between shore ground and boat ground to prevent the flow of destructive galvanic currents between the shore ground and the boat ground while maintaining the safety function of a neutral ground. The galvanic isolator of the invention includes a blocking element positioned between the boat ground and the shore ground that can be switched between an open and a closed state by a trigger circuit. The trigger circuit closes the blocking element when the voltage difference between the boat ground and the shore ground exceeds a threshold value, such as 1.4 volts. During operation of the galvanic isolator during the high fault current situation, power is dissipated only the blocking element, rather than by the combination of the blocking element and trigger device. In this manner, the galvanic isolator reduces the amount of power dissipated during high current conditions and therefore reduces the amount of heat generated by the galvanic isolator.

U.S. Pat. No. 6,183,625, which issued to Staerzl on Feb. 6, 2001, discloses a marine galvanic protection monitor. A galvanic monitor system uses two annunciators, such like light emitting diodes, to alert a boat operator of the current status of the boat's galvanic protection system. A reference electrode is used to monitor the voltage potential at a location in the water and near the component to be protected. The voltage potential of the electrode is compared to upper and lower limits to determine if the actual sensed voltage potential is above the lower limit and below the upper limit. The two annunciator lights are used to inform the operator if the protection is proper or if the component to be protected is either being over protected or under protected.

U.S. Pat. No. 5,032,095, which issued to Ferguson et al on Jul. 16, 1991, describes a marine engine with galvanic circuit protection which comprises an engine including a coolant jacket and an exhaust port, an exhaust gas discharge system including an exhaust gas manifold communicating with the exhaust port, a high-rise elbow communicating with the exhaust gas manifold, and an exhaust pipe communicating with the high-rise elbow and adapted to convey exhaust gas to an overboard discharge, a high-rise elbow and exhaust gas manifold coolant jacket surrounding the exhaust gas manifold and at least partially surrounding the high-rise elbow and communicating with the exhaust pipe for discharge of coolant from the high-rise elbow and exhaust gas manifold coolant jacket and through the exhaust pipe to an overhead discharge, which high-rise elbow and exhaust gas manifold coolant jacket includes a coolant discharge surface over which coolant is discharged from the high-rise elbow and exhaust gas manifold coolant jacket for flow to the exhaust pipe, a coolant conduit communicating between the engine coolant jacket and the high-rise elbow and exhaust gas manifold coolant jacket and including a portion extending at least as high as the discharge surface of the high-rise elbow and exhaust gas manifold coolant jacket and over which coolant flows, and a supply conduit for supplying coolant to the engine coolant jacket in response to engine operation.

U.S. Pat. No. 5,298,794, which issued to Kuragaki on Mar. 29, 1994, describes an electrical anticorrosion device for a marine propulsion device. The device primarily relates to an electrical anticorrosion device for a marine propulsion arrangement. More particularly, the invention relates to a cathodic protection arrangement which is suitable for use with an inboard/outboard propulsion unit. According to the invention, an anode and a reference electrode are housed with a housing unit which is mounted upon a propulsion unit mounting bracket. The two electrodes are arranged so that each is essentially equidistant from a point located approximately midway across the lateral width of an outboard drive unit, which unit is secured to the mounting bracket when the unit is positioned for driving the associated watercraft in a generally forward direction. The electrode housing further serves as a low speed/idle exhaust gas device which breaks up exhaust gas bubbles which otherwise might cause loud and objectionable noise. Thus, the invention allows for the effective prevention of cathodic corrosion by insuring that a proper current is supplied to a sacrificial anode and, additionally, allows for improved silencing for the low speed/idling exhaust gases of an inboard/outboard drive unit.

The patents described above are hereby expressly incorporated by reference in the description of the present invention.

The proper and safe operation of a marine vessel, when connected electrically to a shore power supply, requires that the cathodic protection circuit, or the galvanic corrosion protection circuit, of the marine vessel is operating properly. Proper operation of this circuit requires that all of its included components are operating properly and the circuit is properly connected to boat and shore grounds. It would be significantly beneficial if a system could be provided which actively inhibits galvanic corrosion of a component of a marine vessel by assuring that the protected component acts as a cathode in a galvanic circuit in which a device external to the marine vessel acts as an anode. Rather than merely preventing harmful galvanic corrosion from occurring, a system of this type could actively inhibit galvanic corrosion of the protected component of the marine vessel.

SUMMARY OF THE INVENTION

A method for inhibiting corrosion of a component of a marine vessel when an electrical system of the marine vessel is connected in electrical communication with an electrical conductor which is external to the marine vessel, in accordance with the preferred embodiment of the present invention, comprises the steps of providing a first circuit point which is connectable in electrical communication with a first point of the component, such as a drive unit, and providing a second circuit point which is connectable in electrical communication with a second point which is connected in electrical communication with the electrical conductor external to the marine vessel. In most embodiments of the present invention, the electrical conductor is a ground wire of a power cable used to connect the marine vessel in electrical communication with a shore power supply. The method of the present invention further comprises the step of decreasing the voltage potential of the first point below a voltage potential of the second point by a preselected differential magnitude.

In a preferred embodiment of the present invention, the decreasing step comprises the step of causing an electronic current to flow in a direction from the second point to the first point in order to cause the component, such as drive unit of a sterndrive or outboard motor system, to achieve a lower voltage potential than the potential at a nearby location in the body of water in which the marine vessel is being operated. The causing step is performed periodically in a preferred embodiment of the present invention and is followed by periods of time when no electric current flows in a direction from the second point to the first point.

In certain embodiments of the present invention, it can further comprise the step of measuring a voltage potential of a third point which is representative of the voltage potential at the first point. The third point can be an electrode submerged in the water near the marine drive, which is connected in electrical communication to the first point, and the electrode can be physically attached to the transom of the marine vessel. The voltage potential of the third point is measured relative to the voltage potential of the first point in a preferred embodiment. In a preferred embodiment, the electrode used as the third point is preferably disposed within a preselected distance from the component being protected from corrosion. If the third point is attached to the transom of a marine vessel, and the component being protected from corrosion is the drive unit of a sterndrive system or outboard motor, the electrode used to provide the third point is preferably disposed within twelve inches of the marine propulsion device. The third point is intended to represent the voltage potential near the component being protected, but not in direct electrical contact with the component being protected.

In a preferred embodiment of the present invention, the first and second circuit points are connectable to a ground wire of a three wire electrical power cable which, in time, is connected in electrical communication between a shore-based source of electrical power and an electrical system of the marine vessel. The ground wire is typically connected to a physical ground on shore and to the boat ground which is connected in electrical communication with the metallic housing structure of the marine propulsion device.

In a preferred embodiment of the present invention, the preselected differential magnitude of voltage potential, between the first point and a region proximate the second point, as measured at the third point, is approximately 0.94 volts.

In a preferred embodiment of the present invention, it further comprises the step of determining whether the marine propulsion device is disposed in salt water or fresh water. It can further comprise the step of selecting a magnitude of the electronic current as a function of whether the marine propulsion device is disposed in salt water or fresh water. If the marine propulsion device is disposed in salt water, a duty cycle of approximately 8% is used when pulsing the electronic current in a direction from the shore ground to the boat ground. Alternatively, if the marine propulsion system is disposed in fresh water, the electronic current is pulsed at a duty cycle of approximately 0.8%. It should be understood that the precise percentage of the duty cycle is dependant on the instantaneous value of the electronic current magnitude. However, in a preferred embodiment of the present invention, with a particular instantaneous current magnitude, the duty cycle of the electronic current pulses in a salt water situation is ten times the duty cycle in a fresh water situation. In this particular embodiment of the present invention, for a sea water application, the peak voltage was 1.4 volts and this resulted in a 100 milliamp peak current. The average current was approximately 8 milliamps. In fresh water, the peak voltage was 1.4 volts, the peak current was 10 milliamps, and the average current was 0.08 milliamps.

The basic concept of the present invention comprises the step of lowering the voltage potential of the component being protected (e.g. the marine propulsion drive unit) to a magnitude which is less than the magnitude of voltage potential at a ground point which is external to the marine vessel. That ground point can typically be a ground point of a shore power system to which the marine vessel is connected to receive electrical power. However, it should be understood that alternative systems could use a ground point external to the marine vessel which is not directly associated with an electrical power system.

BRIEF DESCRIPTION OF THE DRAWINGS

The present invention will be more fully and completely understood from a reading of the description of the preferred embodiment in conjunction with the drawings, in which.

DESCRIPTION OF THE PREFERRED EMBODIMENT

Figure 1:
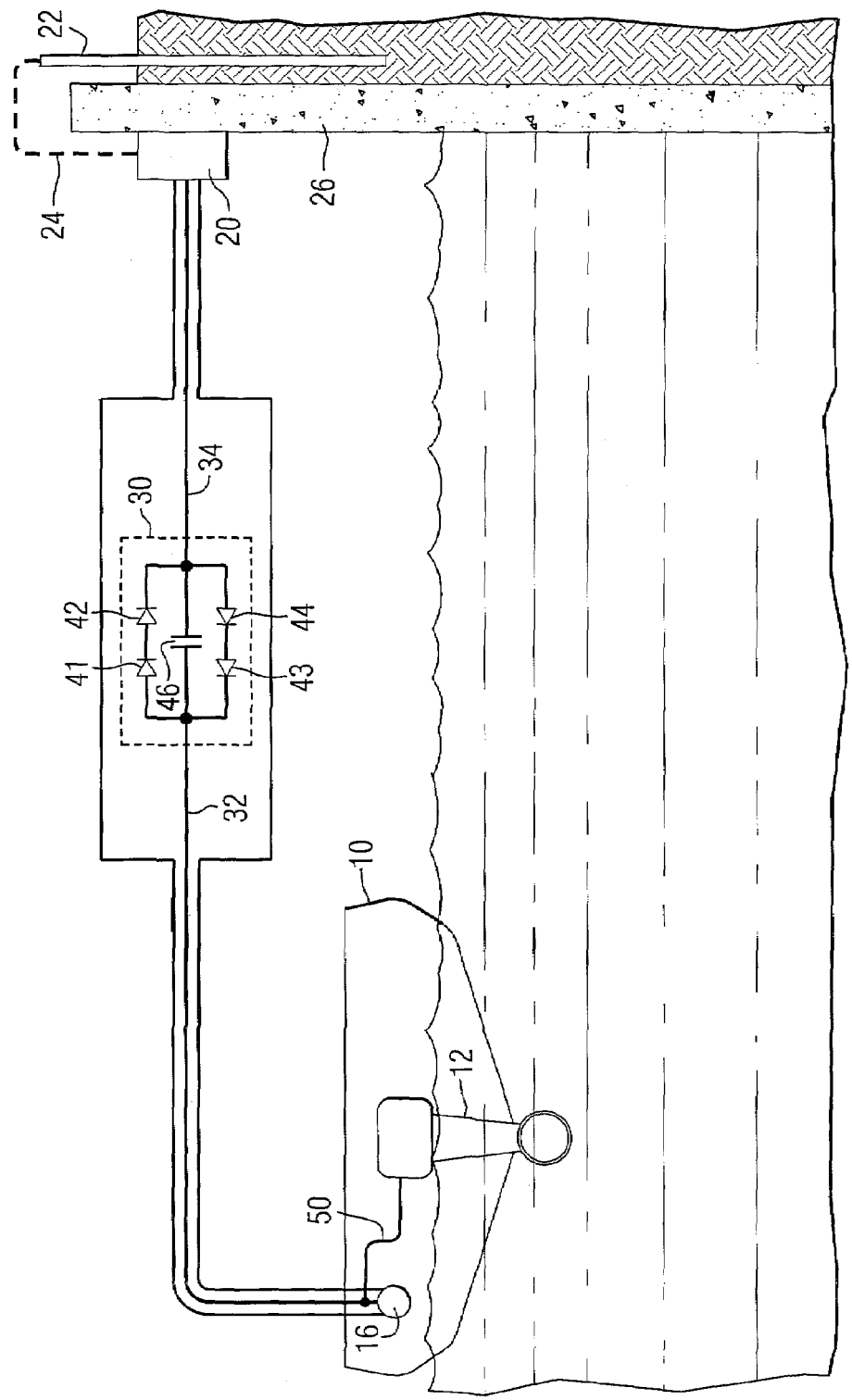
FIG. 1 shows an arrangement of a marine vessel and a shore power source in conjunction with a cathodic protection circuit as is well known to those skilled in the art.

Throughout the description of the preferred embodiment of the present invention, like components will be identified by like reference numerals.

The following discussion, in conjunction with FIGS. 1–8, describe the invention which is disclosed and claimed in U.S. patent application Ser. No. 09/933,440, which was filed on Aug. 20, 2001 and referenced above. That patent application relates directly to a method and apparatus for testing an electrical system of a marine vessel, such as the galvanic isolator that is frequently used to protect components of marine vessels from galvanic corrosion. That method and apparatus for testing a galvanic isolator comprises many of the components used by the present invention which relates more directly to a method for actively inhibiting the corrosion of the protected component by causing the protective component to act as a cathode in a galvanic circuit when the marine vessel is connected in electrical communication with an external ground, such as the ground of a shore power system.

FIG. 1 is schematic representation of a marine vessel 10 with a marine propulsion system 12. The marine vessel 10 has an electrical system 16 which is connected in electrical communication with a shore power system 20 in a manner which is well known to those skilled in the art. The shore power system 20 is typically grounded through the use of a grounding rod 22 connected to a ground connection of the shore power system 20 as illustrated by a dashed line connection 24. In addition, a metallic piling or sea wall 26 typically provides an electrical grounding connection, between the shore and the water in which the marine vessel 10 is operating.

In FIG. 1, a cathodic protection system 30 is connected in electrical communication between the ground wire 32 of the electrical system 16 of the marine vessel 10 and the ground wire 34 of the shore power system 20. The cathodic protection system comprises a first set of diodes (e.g. diodes 41 and 42) and a second set of diodes (e.g. diodes 43 and 44) connected in combination with a capacitor 46. This arrangement of components of the cathodic protection circuit 30 is well known to those skilled in the art and will not be described in detail herein. Cathodic protection systems like that represented within the dashed line box of FIG. 1, and identified by reference numeral 30, are available in commercial quantities.

With continued reference to FIG. 1, the marine propulsion system 12 is connected electrically to the boat ground 32 by connection line 50. If any of the components of the cathodic protection circuit 30 fails, the effectiveness of the protection circuit will be severely diminished. In addition, if the cathodic protection circuit 30 is improperly connected to the boat ground 32 or the shore ground 34, its operation will be seriously compromised. The failure of components or the incorrect connection of the cathodic protection circuit 30 can result in personal injury or serious property damage. The purpose of the present invention, as will be described in greater detail below, is to provide an effective monitoring circuit which quickly and accurately reacts to a failure or misconnection of the cathodic monitoring system 30 and its internal components.

Figure 2:
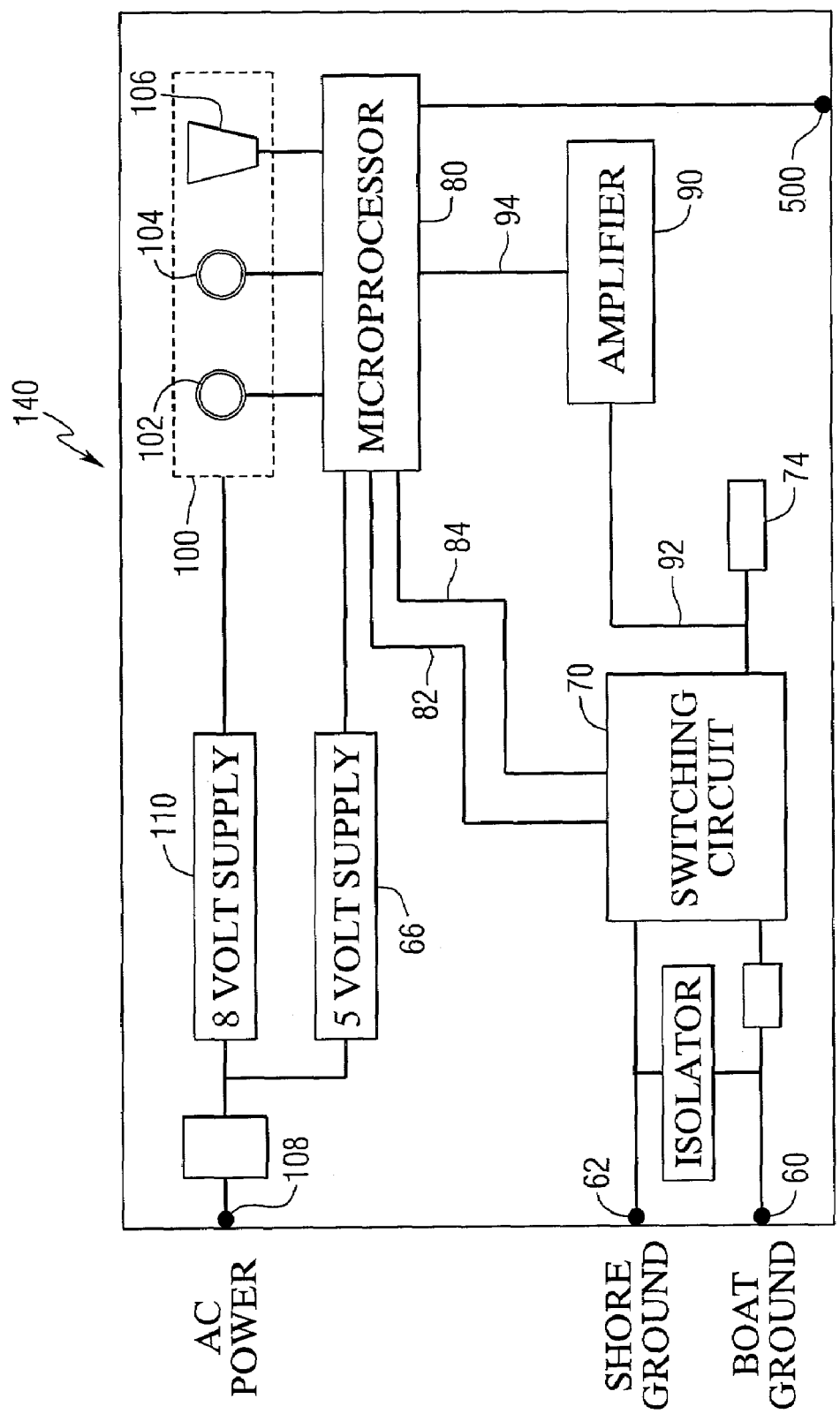
FIG. 2 is a simplified electrical schematic of a circuit used to implement the present invention.

The apparatus of the present invention is illustrated schematically in FIG. 2. It comprises a first circuit point 60 which is connectable to the electrical circuit of a marine vessel. In other words, it is connectable to the boat ground 32. A second circuit point 62 is connectable to the shore power system. In other words, it is connectable to the shore ground 34 described above. In a typical application of the present invention, the isolator shown connected between points 60 and 62 is not part of the circuit 140, itself, but is connected between circuit points 60 and 62 at a location external to the circuit 140. Although this isolator can be physically separated from the other components of the circuit 140, its function is the same as represented in FIG. 2. A power supply is configured to provide a DC voltage of a preselected magnitude, such as eight volts DC. A switching circuit 70 is connected in electrical communication with the power supply and with the first and second circuit points, 60 and 62. Although the connection between the switching circuit 70 and the power supply is not explicitly shown in FIG. 2, it should be understood that the connection between the switching circuit 70 and the power supply is provided through a reference component 74 which, in turn, is connected to a circuit ground of the electrical circuit shown in FIG. 2. The switching circuit 70, which can be an H-bridge circuit, is configured to cause a preselected voltage magnitude providing by the power supply to be imposed across the first and second circuit points, 60 and 62, in either of two opposite polarities. The switching circuit 70 can then reverse the polarity to reverse the voltage potential between the boat ground 60 and the shore ground 62.

With continued reference to FIG. 2, a microprocessor 80 is connected in electrical communication with the switching circuit 70, as represented by lines 82 and 84, in order to allow the microprocessor 80 to control the selection of the two possible connection polarities between the boat ground 32 and shore ground 34 and the power supply 66. The reference component 74 is connected in electrical communication with the switching circuit 70 and in series with the electrical system of the marine vessel, which is connectable between the boat ground 60 and the shore ground 62 as will be described in greater detail below. The reference component 74, which can be a reference resistor, provides a signal which is representative of an electrical current flowing through the electrical system of the marine vessel, between the boat ground connection point 60 and the shore ground connection point 62, and the reference component 74 is connected in electrical communication with the microprocessor 80 so that the microprocessor can determine the magnitude of current flowing through the electrical system connected between circuit points 60 and 62.

As shown in FIG. 2, an amplifier 90 is provided to amplify the signal received on line 92 and provide an amplified signal on line 94 to the microprocessor. In a preferred embodiment of the present invention, the signal received by the amplifier 90 on line 92 is representative of the voltage drop across a reference resistor which is used as the reference component 74.

The microprocessor 80 is configured to compare the signal received on line 94 to a predetermined reference magnitude which allows the microprocessor 80 to compare the current signal received on line 94 to the reference magnitude in order to determine the operational status of the marine vessel's electrical system.

With continued reference to FIG. 2, an annunciator device 100 provides a green LED 102, a red LED 104, and a horn 106 which allows the microprocessor to alert the marine vessel operator if the electrical system of the marine vessel 10 is not in proper operating condition. In other words, the components of the cathodic protection circuit 30 are monitored along with the connection of the cathodic protection system 30 to the boat ground 32 and shore ground 34. If any one of a plurality of fault conditions is detected, the microprocessor 80 uses the annunciator device 100 to alert the operator of this fact.

Figure 3:
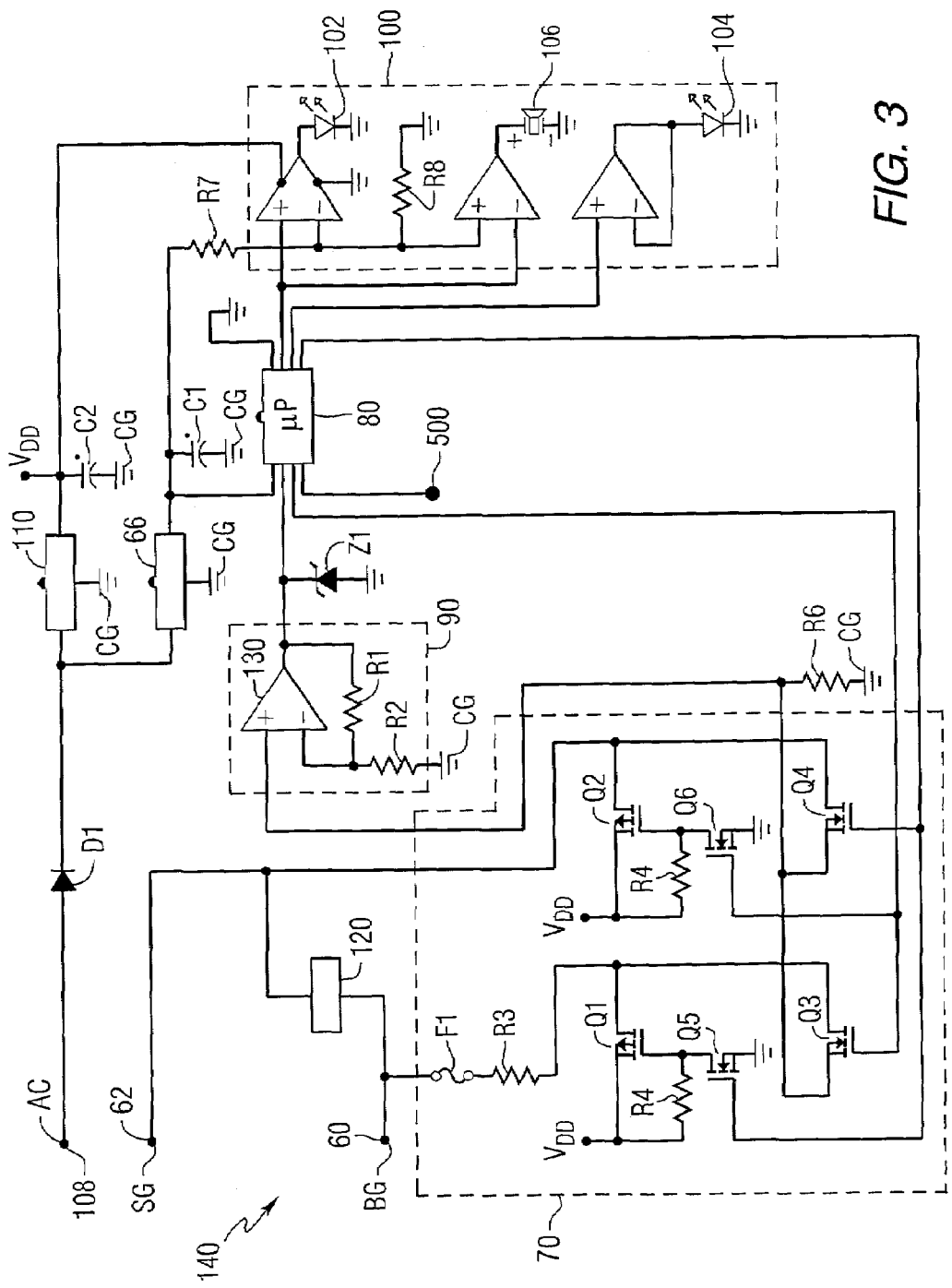
FIG. 3 is a more detailed electrical schematic of the circuit of FIG. 2.

FIG. 3 is an electrical schematic diagram of a circuit which performs the intended function of the present invention. AC power is received at point 108 and is converted by power supplies 66 and 110 to DC power at 5 volts and 8 volts magnitudes, respectively. The 8 volt power supply 110 is used to power the annunciator device 100 and switching circuit 70. It should also be understood that the circuit ground symbols CG used throughout the schematic diagram of FIG. 3 represent the interconnection of the components shown in FIG. 3 and do not represent a ground connection to either the boat ground 32 or the shore ground 34. Furthermore, it should be understood that the connection point 108 to the AC power supply, used to provide power to the circuit of FIG. 3, is connected through an isolating device, such as a transformer, to avoid any connection between the components shown in FIG. 3 and either the boat ground 32 or the shore ground 34. The components identified in FIG. 3 are shown in Table I along with their values or type identifications. It should be understood that various other combinations of components can be used to perform the function of the present invention. The amplifier components 130 of the amplifier 90 is identified as type LM324, along with the three amplifier components used in conjunction with the annunciator device 100. All of the components shown in FIG. 3 are available in commercial quantities and their individual functions are well understood by those skilled in the art. Therefore, the individual operation of each of the components in FIG. 3 will not be described in detail herein. Reference numeral 140 is used throughout this description to identify the circuit of the present invention.

TABLE I

| REFERENCE | COMPONENT TYPE OR VALUE |
|---|---|
| R1 | 1,000 kΩ |
| R2 | 15 kΩ |
| R3 | 5Ω |
| R4 | 10 kΩ |
| R5 | 10 kΩ |
| R6 | 0.2Ω |
| R7 | 10 kΩ |
| R8 | 10 kΩ |
| C1 | 10 µF |
| C2 | 10 µF |
| D1 | 1 A |
| Z1 | 4.7 volts (1N5230) |
| Q1 | IRF9540 |
| Q2 | IRF9540 |
| Q3 | MTP3055V |
| Q4 | MTP3055V |
| Q5 | 2N7000 |
| Q6 | 2N7000 |

Figure 4:
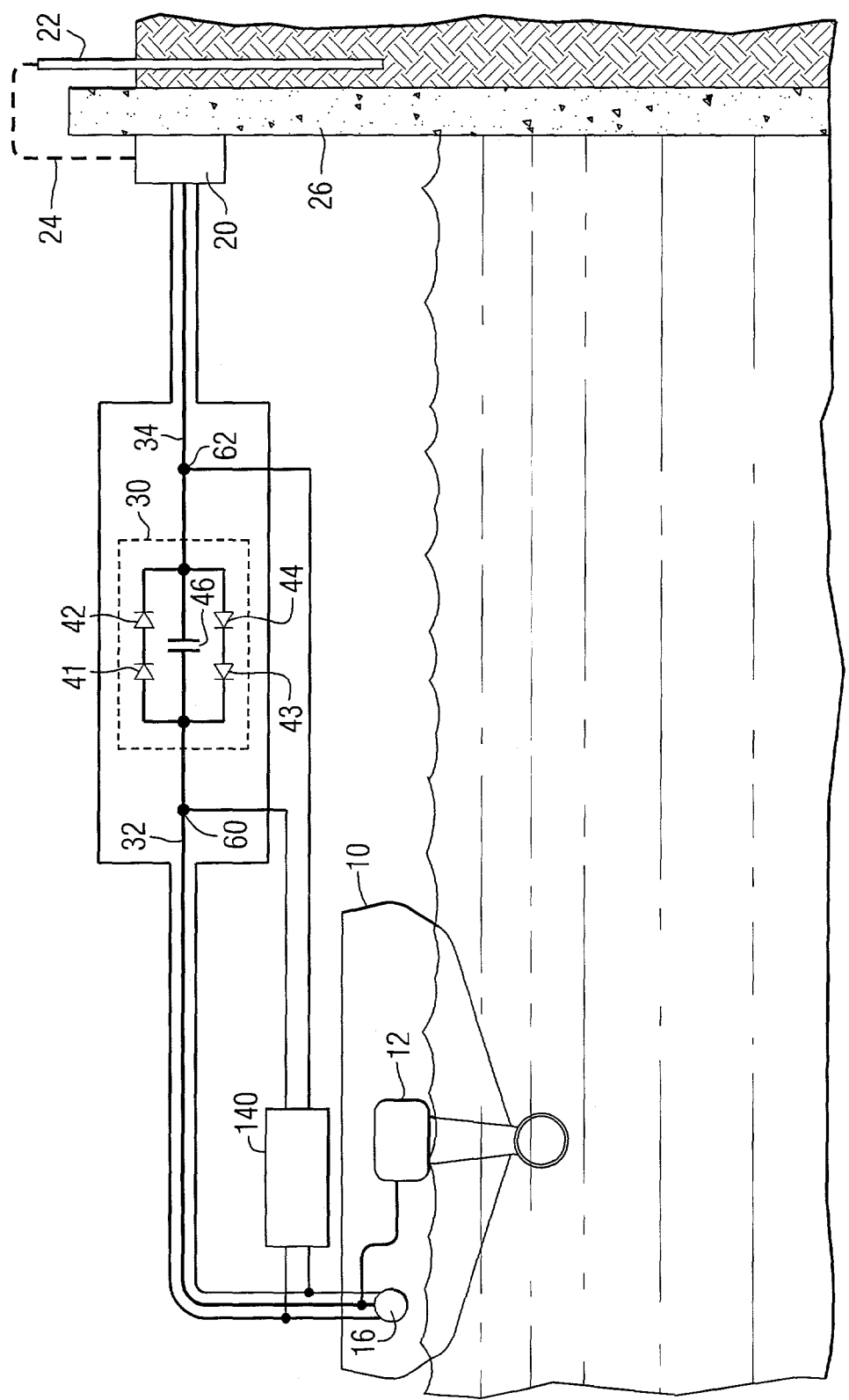
FIG. 4 shows the arrangement of FIG. 1 with the present invention connected to the cathodic protection circuit.

FIG. 4 is generally similar to FIG. 1, but with the circuit of the present invention 140 connected to the boat ground 32 and the shore ground 34 at points 60 and 62, respectively. The present invention is intended to be connected to opposite sides of the cathodic protection circuit 30 in order to monitor the current flowing through the cathodic protection circuit 30 by imposing a voltage across the cathodic protection circuit and then changing that voltage. It should be understood that it is the sudden change in the voltage magnitude that provides the detectable current pulse which the present invention uses to determine the operating condition of the circuit 30.

Figure 5:
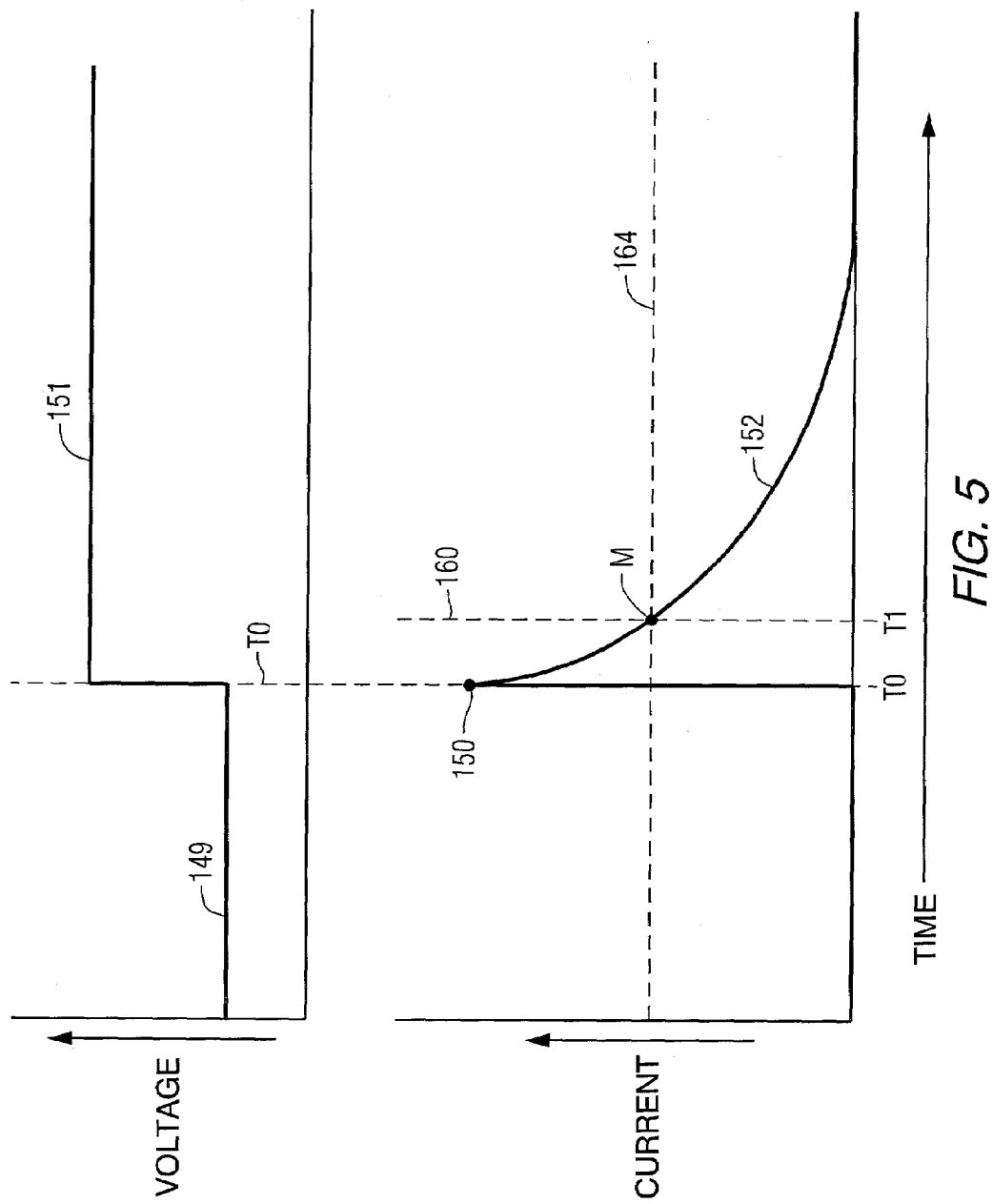
FIG. 5 shows a typical current response curve for a capacitive circuit.

In order to more clearly understand the operation of the present invention, FIG. 5 is provided to show a typical current waveform that results when a voltage change is imposed across a circuit having a capacitor as one of its components. In the upper portion of FIG. 5, a voltage magnitude across the circuit is changed from a first magnitude 149 to a second magnitude 151. That magnitude change occurs at time T0. Although the magnitude change from the first magnitude 149 to the second magnitude 151 shows an increase in the value of the voltage potential at time T0, it should be understood that a change can be caused by the present invention in the opposite direction. In fact, the preferred embodiment of the present invention subsequently reverses the conditions by suddenly changing the voltage potential across the circuit being tested from the second magnitude 151 back to the first magnitude 149. The reversal in polarity of the voltage potential across the circuit being tested will result in a current flowing in the opposite direction. However, the basic premises of the present invention can be used under both circumstances. By changing the voltage potential in one direction and then reversing the procedure, the circuit being tested can be more fully and completely tested to ascertain the proper operating condition of its individual components and its connection to the boat ground and shore ground. If the voltage change is suddenly imposed across the capacitive circuit at time T0, a current inrush will occur and the current magnitude will rise to a first point 150. Then, depending on the values of the selected components in the capacitive circuit, the current magnitude will decrease along a characteristic curve 152. The basic shape of curve 152 is that which is typical in a capacitive circuit subsequent to a change in voltage across the circuit.

With continued reference to FIG. 5, it can be seen that if the current magnitude is measured at a preselected time duration subsequent to time T0, such as that represented by dashed line 160, a decreasing current value will be measured. The magnitude M of this current measured at time T1 is represented by dashed line 164. In other words, if a voltage change is imposed across a capacitive circuit at time T0, the current flowing through that capacitive circuit will rise suddenly to point 150 and then decrease along the characteristic curve 152. If the current magnitude is measured at a preselected time subsequent to time T0, such as that represented at time T1 by dashed line 160, a current magnitude M of a value represented by line 164 will be measured. The basic concept of the decreasing current represented by curve 152, subsequent to an initial change in voltage potential across the capacitive current, is used by the present invention to monitor and evaluate the operability of the various components of the cathodic protection circuit 30 and, in addition, to evaluate the connection between the boat ground 32 and the shore ground 34. These evaluations will be described in greater detail below.

Figure 6A:
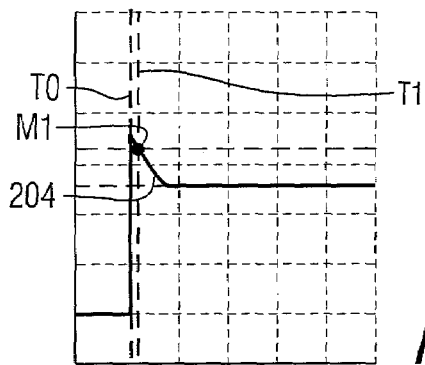
FIGS. 6A–6D show various current waveforms used in the operation of the present invention.

FIGS. 6A–6D represent various conditions under which the present invention can identify certain fault situations. It should be understood that FIGS. 6A–6D share a common horizontal axis of time. Throughout the discussion of FIGS. 6A–6D and the subsequent discussion of FIGS. 7A–7C, it should be understood that in each circumstance represented by each of the Figures, the present invention causes a sudden voltage change to occur across the circuit being tested at time T0. Throughout the description of FIGS. 6A–6D and 7A–7C, it should also be understood that the change in voltage potential across the circuit being tested can be reversed in polarity. In fact, a preferred embodiment of the present invention does reverse the polarity as a second step of the testing procedure. However, the reversal of polarity has a similar effect on the circuit being tested, but in an opposite direction. Therefore, the details of the reversing procedures and measuring practices will not be described in significant detail herein. The various tests, which will be described below, typically measure the current at time T1 approximately 10 milliseconds after time T0. However, some of the tests measure the current at a time T1 which is 100 milliseconds after time T0. It has determined that certain tests are more reliable with a 100 millisecond time delay between time T0 and time T1 while others can be satisfactorily completed with a time delay of 10 milliseconds. Curve 204 in FIG. 6A represents the current flowing through the cathodic protection circuit 30 as a result of the sudden change in voltage across circuit points 60 and 62. Although the relative magnitudes of the current peaks of waveform 204 in FIG. 6A are not identical to that represented in the exemplary waveform 152 in FIG. 5, it should be understood that in all of the current graphs described herein, the characteristic shape of line 152 in FIG. 5 is inherent in the waveforms described in later figures. At time T0, the current flowing between circuit points 60 and 62 increases suddenly and then begins to decrease according to the characteristic shape of a capacitive circuit current. If this current magnitude is measured at time T1, a magnitude M1 is obtained. In a prototype circuit of the present invention, using components such as those identified above in conjunction with FIG. 3, a properly configured and connected cathodic protection circuit 30 results in a current magnitude M1 of approximately of 1.61 Amperes. This current magnitude is represented by a signal provided as a voltage drop across the reference component 74 in FIG. 2, which is the reference resistor R6 shown in FIG. 3. The situation represented in FIG. 6A is a normal situation with all of the components of the cathodic protection circuit operating correctly and with the cathodic protection circuit 30 properly connected between both ground 32 and shore ground 34. The current signal eventually decreases to approximately 1.25 Amperes.

Figure 6B:
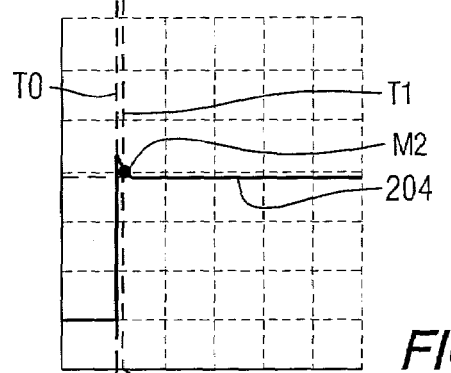

FIG. 6B shows the results of a similar operation, but with one of the diodes, 41–44, shorted. In FIG. 6B, the base level of current 204 between peaks, of approximately 1.40 Amperes, is slightly higher than in FIG. 6A because of the shorted diode. In addition, the current in FIG. 6B rises to a magnitude which is less than that shown in FIG. 6A in response to the sudden change in voltage at time T0. In addition, the current measurement made at time T1, which is represented as M2 in FIG. 6B, is less than magnitude M1. This indicates a shorted diode. As a result, it can be seen that a predetermined reference magnitude of current can be used to distinguish between the conditions shown in FIGS. 6A and 6B.

Figure 6C:
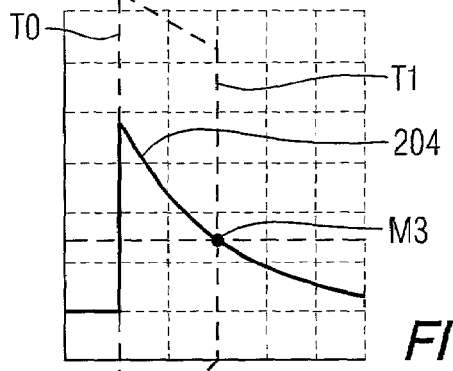

FIG. 6C illustrates the results observed when one of the diodes, 41–44, is in an open condition. The sudden voltage change at time T0 results in a significant change in current 204, followed by the characteristic decrease. In this test for an open diode, time T1 is 100 milliseconds later than time T0 in order to allow for a more accurate and reliable result. The current measured at time T1 as represented by M3 in FIG. 6C, is approximately 0.7 Amperes. This is significantly lower than magnitude M1 which is expected in a normal situation with no failed components.

With reference to FIGS. 6A–6C, it can be seen that a predetermined reference magnitude for reference range around magnitude M1 can be used to distinguish between a shorted diode as represented in FIG. 6B and an open diode as represented in FIG. 6C. Using appropriately selected predetermined reference magnitudes, the result in FIG. 6B can easily be identified as a shorted diode and the result in FIG. 6C can easily be identified as an open diode.

Figure 6D:
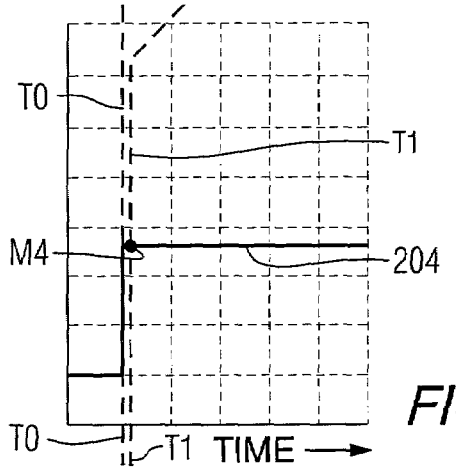

FIG. 6D illustrates a situation in which the capacitor 46 is open in the cathodic protection circuit 30. When the voltage is suddenly changed at time T0, no change in current 204 is sent. As a result, the magnitude of the measured current M2 at time T1 is approximately 1.25 Amperes. If a predetermined reference magnitude, based on magnitude M1 shown in FIG. 6A, is selected, an open capacitor can easily be detected by the present invention.

With reference to FIGS. 6A–6D, it can be seen that using the expected magnitudes of the normal current reaction illustrated in FIG. 6A allows the present invention to determine whether or not the diodes of the cathodic protection circuit 30 are shorted or open, as represented in FIGS. 6B and 6C, or whether the capacitor 46 is open as represented in FIG. 6D.

Figure 7A:
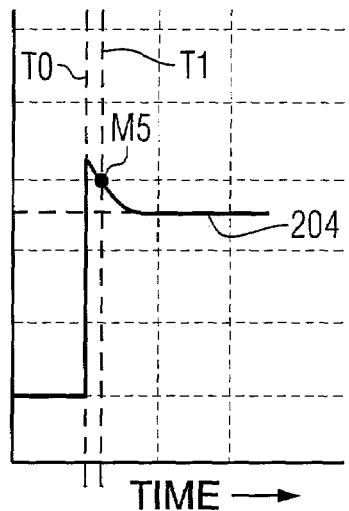
FIGS. 7A–7C show various current waveforms used in the present invention to determine an open ground connection situation.
Figure 7B:
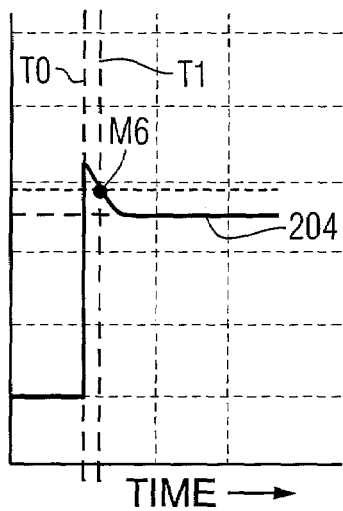
Figure 7C:
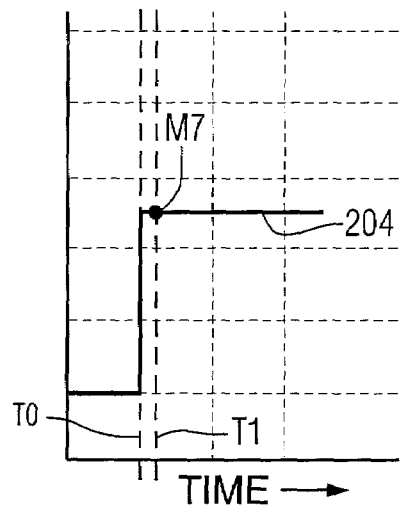

FIGS. 7A–7C will be used to illustrate how the circuit of the present invention determines whether or not the boat ground 32 is properly connected to the shore ground 34. In FIG. 7A, the voltage is held constant for a period of approximately 2.5 seconds to allow the current 204 to stabilize in order to make sure that the current value 204 has reached its minimum value according to the characteristic waveform 152 described above in conjunction with FIG. 5. The current is then removed for approximately 2.5 seconds. Then, at time T0, the voltage is reapplied. FIG. 7A represents the resulting current 204 when the circuit is properly connected and the marine vessel 10 is in seawater and FIG. 7B shows the current 204 when the marine vessel is in fresh water. The current magnitude M5 shown in FIG. 7A is approximately 1.47 Amperes and the current magnitude M6, when the marine vessel 10 is in fresh water, is approximately 1.41 Amperes. As can be seen, the difference between seawater in FIG. 7A and fresh water in FIG. 7B is very slight.

In FIG. 7C, the cathodic protection circuit 30 has an open connection between the boat ground 32 and the shore ground 34. As a result, the sudden change in voltage has a diminished effect on the current magnitude M7, which is approximately 1.25 Amperes. In this example, if a predetermined reference magnitude of 1.30 Amperes is used, the results in FIGS. 7A and 7B would be determined to be satisfactory, whereas the result in FIG. 7C would indicate an open ground connection which is an unsafe condition.

Figure 8:
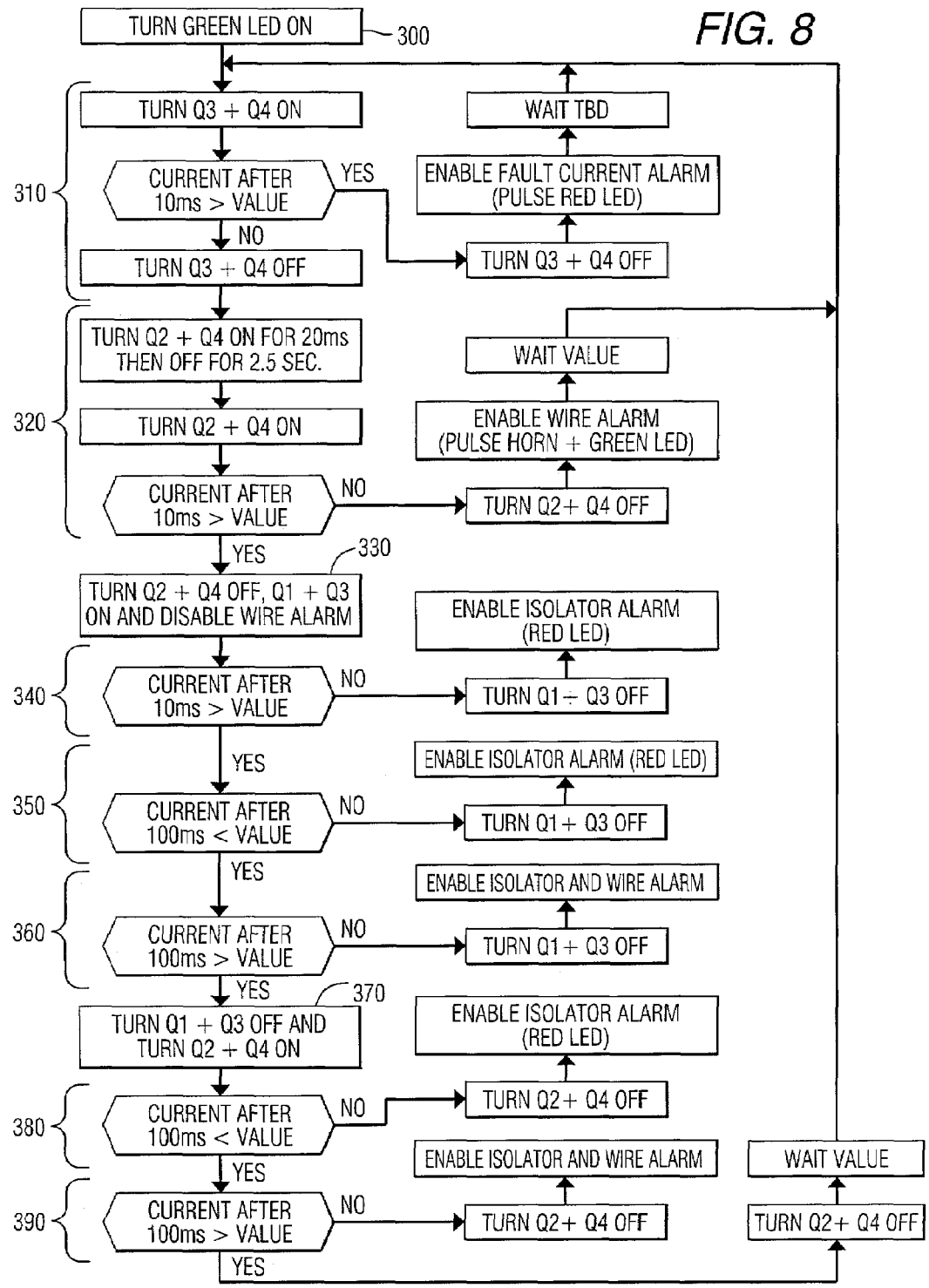
FIG. 8 is an exemplary flow chart of a program contained in the microprocessor of the present invention.

FIG. 8 represents an exemplary simplified flow chart showing the procedures performed by the microprocessor 80 of the present invention. In a preferred embodiment, the microprocessor would repeat the steps shown in the flow chart of FIG. 8 on a periodic cycle.

The flow chart of FIG. 8 shows the steps taken by the program in the microprocessor 80, with reference to the components identified in FIG. 3 and in Table I. As can be seen in FIG. 8, the program begins by initializing the system and turning the green LED on. Then a fault current test is begun. This portion of the flow chart is identified by reference numeral 310. Following the completion of the fault current test portion 310, the safety wire continuity test is performed in the portion of the flow chart identified by reference numeral 320. Functional block 330 begins the component integrity test. The interrogations represented by portion 340, 350, and 360 perform the open capacitor test, shorted diode test, and open diode test, respectively. Following this test, the H-bridge is switched to reverse the current direction through the current being tested. Then, as represented by flow chart portions 380 and 390, the shorted diode test and open diode test are performed, respectively. Functional blocks 330 and 370 represent the actions necessary to select and actuate the chosen direction of current flow through the H-bridge switching circuit 70. As can be seen in FIG. 8, the leftmost functional blocks represent preparatory actions and interrogations relating to the various tests performed by the present invention. The functional blocks represented in the central and rightmost portions of FIG. 8 represent actions taken as a function of the various interrogations, including various enunciator light and horn controls and various resetting steps relating to the H-bridge switching circuit 70. The steps represented in the flow chart of FIG. 8 are intended to be repeated at a frequency determined by a preselected time delay wait value as shown. This time delay magnitude would typically be selected as a function of the desired response speed of the system to a fault condition and the available time in the microprocessor's duty cycle. In the interrogation functional blocks of FIG. 8, several comparisons area shown where the electrical current is compared to a value. It should be understood that various different values can be selected for the specific tests performed by the present invention. It should also be understood that the magnitude of these comparison values are selected as a function of the type of circuit being tested by the present invention.

It has been discovered that, using essentially the same system described above, which allows the checking of a galvanic isolator, beneficial electronic currents can be induced in the ground wire and in a direction of electron flow from the shore ground to the boat ground. This electronic current lowers the potential of the protected component, such as the drive unit, to a magnitude which is less than the voltage potential of the shore ground. More precisely, the voltage potential at a location very close to the protected component, but not in direct electrical contact with the protected component, is raised to a magnitude above the protected component. As a result, the protected component becomes the cathode in the galvanic circuit and the shore ground becomes the anode. In effect, the shore ground and all conductive material in contact with it, such as the sea bed and metallic components of the dock or pilings, become the anode in the galvanic circuit. The methodology of the present invention will be described in greater detail below.

Using essentially the same electrical circuitry described above, with minor hardware modifications and certain programming changes, the present invention is able to provide an electronic current into the component being protected in order to make it act as the cathode of the galvanic circuit. As a result, the component connected to the shore ground, including the sea bed and grounded components on shore, are caused to act as the anode in the galvanic circuit.

In order to make the method of the present invention more effective in inhibiting galvanic corrosion, it is helpful to determine whether the component to be protected (e.g. the drive unit of the marine propulsion system) is being operated in salt water or fresh water. As described above, in conjunction with FIG. 5, a sudden change in voltage magnitude, as represented by lines 149 and 151, results in a sudden increase in current followed by a characteristic decrease, as represented by line 152, in a capacitive circuit. The specific reaction of the current flow with respect to the capacitor 46 allows the present invention to determine whether the protected component is disposed in sea water or fresh water.

Figure 9B:
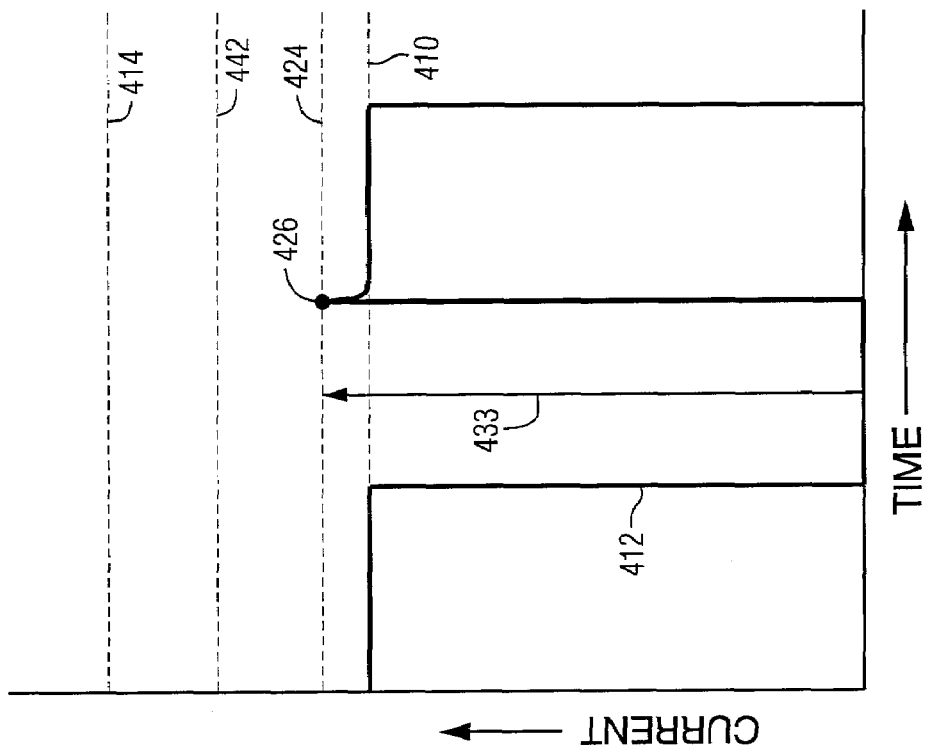
FIGS. 9A and 9B show two current responses for salt water and fresh water, respectively.
Figure 9A:
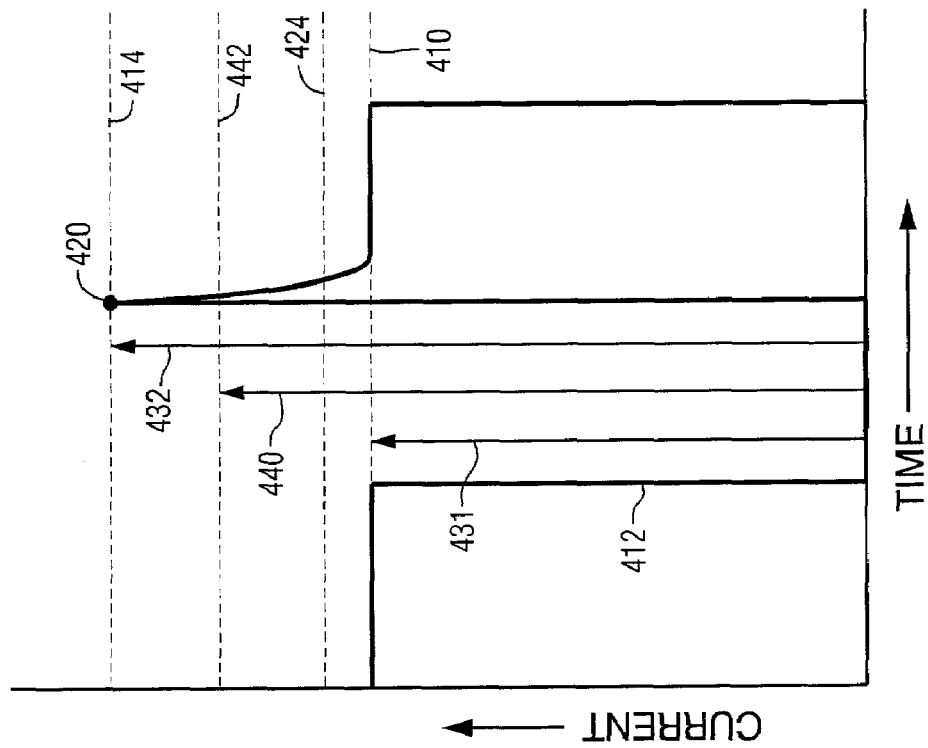

FIGS. 9A and 9B compare two different reactions to a sudden increase in voltage, as evidenced by the current flow through the ground wire, to show the difference in the current magnitude in sea water and fresh water. FIGS. 9A and 9B are intentionally drawn as graphical representations which share a common vertical scale of current magnitude to allow comparison between a salt water example and a fresh water example. In FIG. 9A, the decrease in current from the equilibrium magnitude 410, as represented by line 412, is followed by a preselected time delay before the voltage potential is again imposed on the ground line. When the voltage is again imposed on the ground line, the current rises to a magnitude 414 at point 420. It then decreases, in a characteristic manner for a capacitive circuit, back to the equilibrium magnitude 410.

In FIG. 9B, the imposition of the same voltage potential causes a much lower rise in current, to magnitude 424, at point 426. The response illustrated in FIG. 9B shows the change in current in response to the same change in voltage, but with the protective component disposed in fresh water.

The vertical arrows in FIGS. 9A and 9B represent the values of current at the various magnitudes represented by dashed lines. Magnitude 431 is the equilibrium magnitude of dashed line 410. Magnitude 432 is the magnitude of the maximum current, at point 420, represented by dashed line 414. Magnitude 433 represents the maximum current, at point 426, when the protected component is disposed in fresh water. Magnitude 440, which is the magnitude of dashed line 442, is calculated as a mid point between magnitudes 432 and 433. Dashed line 442 and magnitude 440 are used as a threshold to determine whether the peak current magnitude, 420 or 426, represents the presence of sea water or fresh water, respectively.

It should be understood that the determination of a sea water or fresh water environment can also be determined in the manner described in U.S. Pat. No. 4,528,460 which is discussed above. Various other methods are also generally known to those skilled in the art which enable the determination of sea water or fresh water to be made. The precise method used to make this decision is not limiting to the present invention.

Figure 10:
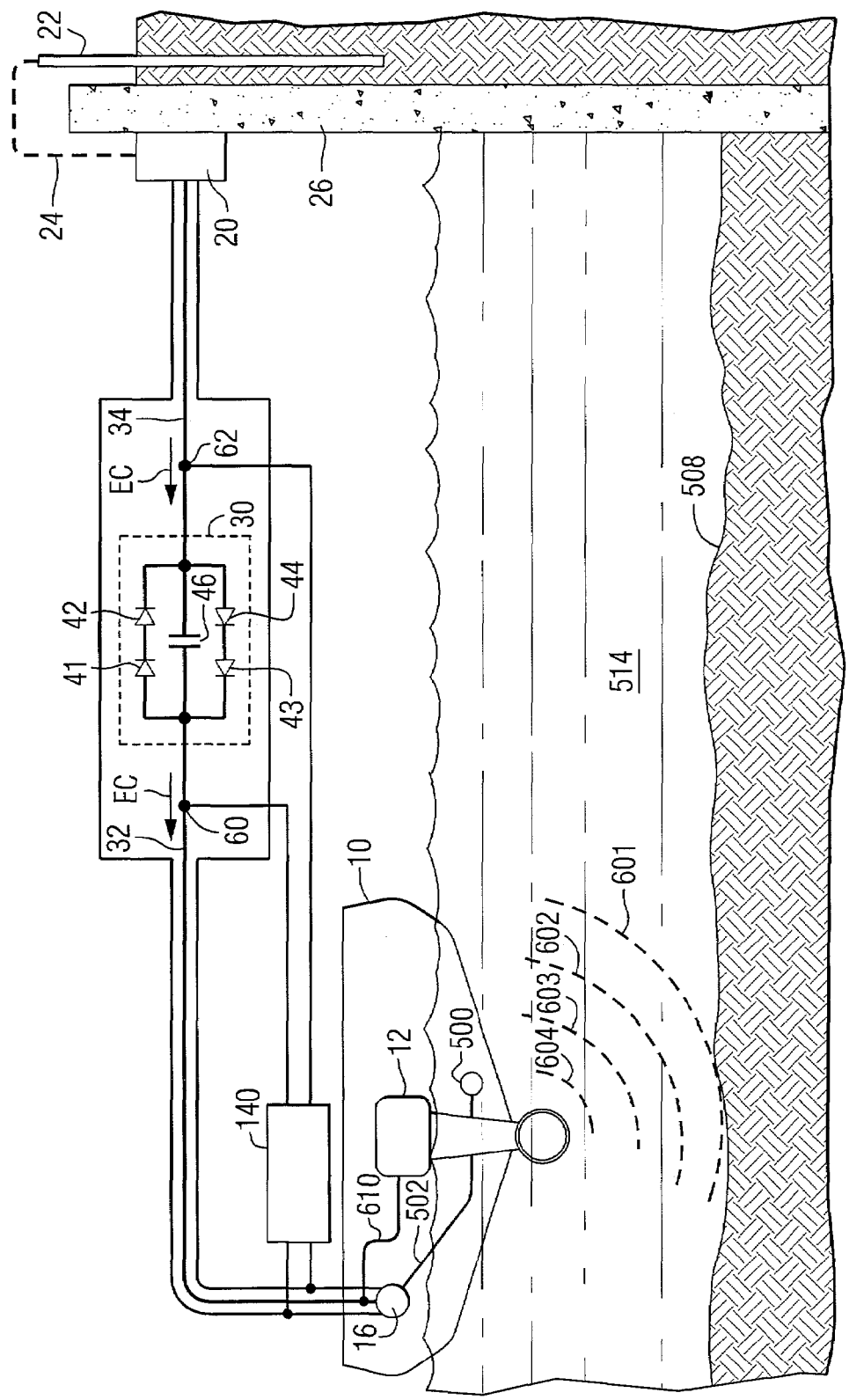
FIG. 10 shows a marine propulsion system connected, through a power cable, to a ground based power source with various components of the present invention connected to the power cable.

FIG. 10 is generally similar to FIG. 4, but with several additional components shown. Arrows EC show the direction of electronic current through the ground wire. Electronic current is hereby defined as the flow of electrons through a conductor. As can be seen in FIG. 10, the electronic current EC flows in a direction from the shore ground connection 34 toward the boat ground connection 32.

In FIG. 10, an electrode 500 is shown connected, by conductor 502, to the electrical system 16 of the marine vessel 10. The component to be protected from galvanic corrosion is the marine propulsion system 12. The sea bed 508 is also shown in FIG. 10. It should be understood that the sea bed 508 is in electrical communication with the metallic piling or sea wall 26 and with the grounding rod 22 which is connected to the shore power electrical system 20 by dashed line 24. By causing an electronic current EC to flow toward the component to be protected, such as the marine propulsion system 12, that component is caused to act as a cathode in the galvanic circuit which comprises the ground wire of the power cable, the marine propulsion device 12, the water 514, the metallic piling or sea wall 26, the grounding rod 22, and the connection 24.

With continued reference to FIG. 10, the voltage potential within the water 514 will vary as a function of the distance from the anode, which comprises the sea bed 508, and the cathode, which comprises the marine propulsion system 12, in the galvanic circuit. The four dashed arcuate lines, 601–604, represents different magnitudes of voltage potential within the water 514 resulting from the flow of electronic current EC into the drive unit, which comprises the marine propulsion device 12, because the drive unit is connected, by line 610, to the ground wire of the electrical system. The voltage potential at dashed arcuate line 601 is greater than the voltage potential at dashed arcuate line 602, and so on, with the voltage potential decreasing as a function of the distance away from the device to be protected (i.e. the marine propulsion system 12) which acts as the cathode in the galvanic circuit.

With continued reference to FIG. 10, the electrode 500 is attached to the transom of the marine vessel 10 and placed at a distance from the drive unit of the marine propulsion system 12 which allows it to provide a measurement of the voltage potential at the location of the electrode 500. This voltage potential is used to represent the actual voltage potential immediately surrounding the material of the device to be protected.

With reference to FIGS. 2, 3, and 10, the magnitude of the voltage potential sensed by the electrode 500 is provided to the microprocessor 80 so that the microprocessor can determine the effectiveness of the present invention in a closed loop arrangement. It should be understood that alternative embodiments of the present invention can be operated without the electrode 500. The duty cycle for sea water and fresh water can be preselected, based on empirical data, and the present invention can operate effectively without having the added information provided by the electrode 500. However, in a preferred embodiment of the present invention, the voltage at the electrode 500 is monitored to precisely determine the effectiveness of the electronic current EC pulses that will be described in greater detail below. When the actual measured voltage at the electrode 500 is known, the duty cycle of the electronic current EC pulses can be dynamically changed in response to changes in the voltage potential at the electrode 500.

Figure 11B:
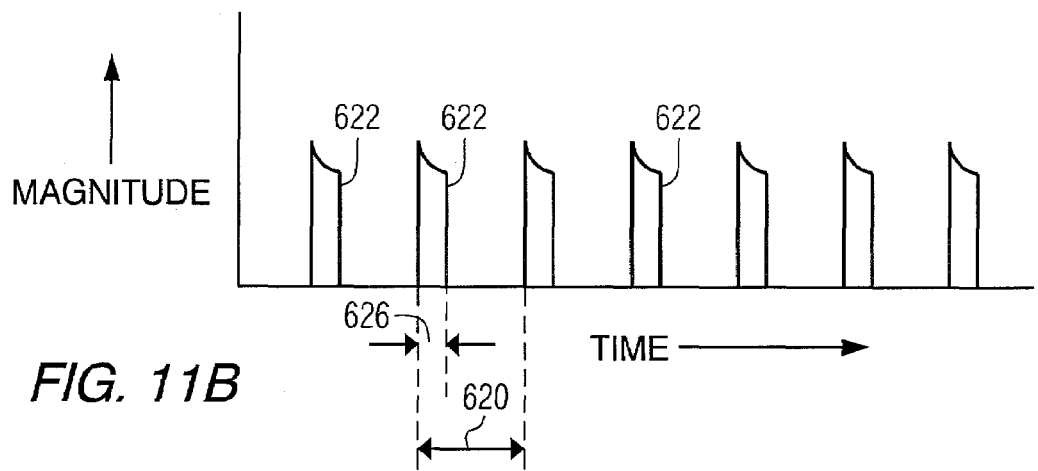
FIGS. 11A and 11B show sequential pulses of an electronic current used in sea water and fresh water applications, respectively.
Figure 11A:
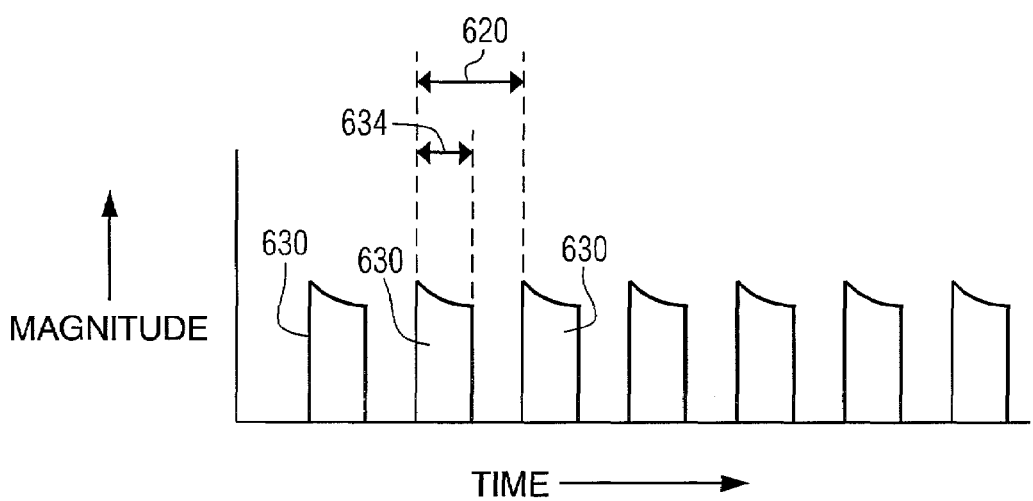

FIGS. 11A and 11B show the sequence of electronic current EC pulses provided by the method of the present invention in order to inhibit galvanic corrosion of a protected component, such as a marine propulsion system 12. FIG. 11A represents the typical duty cycle of the pulses when the protected component is disposed in sea water and FIG. 11B shows the duty cycle when the protected component is disposed in fresh water. As can be seen, FIGS. 11A and 11B are connected by common time dimension lines to more clearly show the difference in duty cycle between sea water and fresh water. The pulses are all started according to a common frequency which displaces the beginning of sequential pulses chronologically by a time magnitude 620. The duration of the current pulse 622 for a fresh water situation is identified by reference numeral 626. The duration of the current pulse 630 in a salt water environment is represented by reference numeral 634. For purposes of this discussion, the duty cycle shall be identified as the percentage of the total time 620 during which the current pulse, 622 or 630, lasts. In a typical sea water application, the pulse length 634 is approximately 8% of the total time 620 between pulse initiations. In fresh water, the pulse duration 626 is approximately on tenth of that duty cycle, or approximately 0.8%. For purposes of clarity, it should be understood that the relative magnitudes of the time durations, 626 and 634, are exaggerated with respect to the time duration 620 between pulse initiations. In a particular embodiment of the present invention, in sea water, the pulse is energized for approximately 0.12 seconds followed by a pause of approximately 1.5 seconds. In fresh water, the pulse is energized for approximately 0.12 seconds, followed by a pause of approximately 12.0 seconds.

Figure 12:
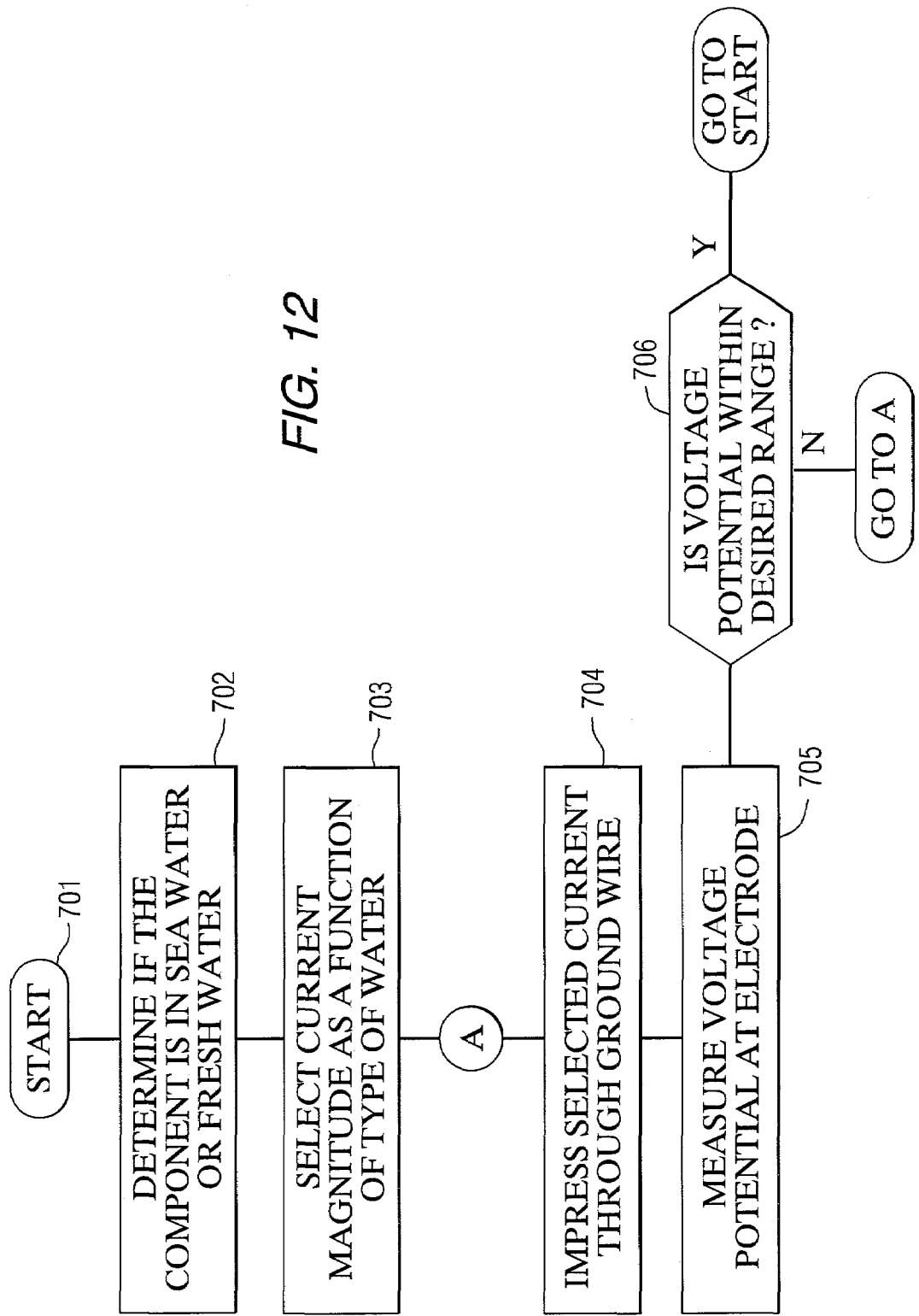
FIG. 12 is a simplified flow chart showing the basic steps of the present invention.

Although the principles of the present invention can be performed in various sequences, FIG. 12 shows a typical sequence of steps that the method of the present invention comprises. From a starting point 701, the present invention determines if the component, such as the marine propulsion system 12, is disposed in sea water or fresh water, as represented by functional block 702. The specific method of making this determination is not limiting to the present invention, but one method is described above in conjunction with FIGS. 9A and 9B and another method is described in detail in U.S. Pat. No. 4,528,460, as discussed above. Based on the determination, in functional block 702, of sea water or fresh water, a current magnitude is selected as a function of the type of water in which the marine vessel 10 is operated. This magnitude determines the duty cycle, as described above in conjunction with FIGS. 11A and 11B. This is represented by functional block 703. An electronic current EC is then impressed on the device to be protected, as represented by functional block 704. Using electrode 500, the voltage potential is measured at a location generally near, but not in contact with, the component to be protected. This is represented by functional block 705. If the voltage potential is within a desired range, as represented by functional block 706, the program can determine that a time delay is desirable, in order to suspend the electronic current EC momentarily, or the duty cycle described above in conjunction with FIGS. 11A and 11B, can be altered to lessen the electronic current EC flow. The desired voltage potential, measured at the electrode 500, is approximately 0.940 volts. Naturally, a tolerance band can be used to determine whether or not the voltage at the electrode 500 is within acceptable limits. If the measured voltage potential at the electrode 500 is less than the desired range, the system can return to point A and continue the current pulses shown in FIGS. 11A and 11B.

With particular reference to FIGS. 2, 3, 9A, 9B, 10, 11A, 11B, and 12, it can be seen that the method for inhibiting corrosion of a component, such as the marine propulsion system 12, of a marine vessel 10 when an electrical system 16 of the marine vessel 10 is connected in electrical communication with an electrical conductor which is external to the marine vessel 10. Although the present invention has been described in conjunction with an electrical conductor which is the shore ground 34 of a shore electrical power system, it should be understood that the shore power system 20 is not a requirement in all embodiments of the present invention. In addition, it should also be understood that any conductor, such as the ground wire of the power connector cable in FIG. 10, can be used to cause the protected component to act as a cathode in relation to an external body, such as the sea bed 508 or sea wall 26, which acts as an anode. The method of the present invention provides the step of providing a first circuit point 60 that is connectable in electrical communication with a first point, such as the boat ground, of the component to be protected. Since the component to be protected is the marine propulsion system 12 shown in the example of FIG. 10, it is the first point of the component and wire 610 connects it to the ground wire to which the first circuit point 60 is connected. The present invention also comprises the step of providing a second circuit point 62 which is connected in electrical communication with the electrical conductor which is the ground wire in FIG. 10. The shore ground 34 is shown connected to the second circuit point 62. Therefore, in the example illustrated in FIG. 10, the second point is the shore ground 34 and its ultimate connection to the grounding rod 22. The method of the present invention further comprises the step of decreasing the voltage potential of the first point, which is connected to the protected component, below the voltage potential of the second point 34 which is connected to the sea bed 508 and the sea wall 26. The decrease in the voltage potential of the component that is protected is reduced to provide a differential magnitude of approximately 0.940 volts between it and the anode, which is the sea bed 508 and the sea wall 26. The decreasing step of the present invention comprises the step of causing an electronic current EC to flow in a direction from the second point 34 to the first point 32, as represented by the arrows in FIG. 10. The causing step is performed periodically, as illustrated in FIGS. 11A and 11B, and is followed by periods of time when no electronic current flows in a direction from the second point 34 to the first point 32. Although the duty cycles shown in FIGS. 11A and 11B are clearly less than 100%, it should be understood that all duty cycles from 0% to 100% are within the scope of the present invention and are selected as a function of the type of water in which the marine vessel 10 is operated and the instantaneous measured magnitude of the voltage potential at the electrode 500.

A preferred embodiment of the present invention further comprises the step of measuring the voltage potential of a third point, where the electrode 500 is located, which is representative of the voltage potential proximate the first point, which is connected in electrical communication with line 610. Line 610 is connected in electrical communication with the boat ground 32. The boat ground 32, in turn, is connected to the first circuit point 60.

In a preferred embodiment of the present invention, the voltage potential of the third point, measured at the electrode 500, is measured relative to the voltage potential of the first point, which is measured at the boat ground 32. The third point, at the electrode 500 is located on a transom of the marine vessel, in a preferred embodiment of the present invention. In a particularly preferred embodiment of the present invention, the third point, at the electrode 500, is placed within approximately 12 inches of the marine propulsion device 12. The first and second circuit points, 60 and 62, are connectable to a ground wire of a three wire electrical power cable which is connected in electrical communication between a shore based source of electric power 20 and an electrical system 16 of the marine vessel 10. In a particularly preferred embodiment of the present invention, the preselected differential magnitude of voltage potential, between the third point at the electrode 500 and the first point at the marine propulsion system 12, is generally equal to approximately 0.94 volts.

In a preferred embodiment of the present invention, the method further comprises the step of determining whether the marine propulsion device is disposed in salt water or fresh water. This determining step was described above in conjunction with FIGS. 9A and 9B. The present invention further comprises the step of selecting a magnitude of the electronic current EC as a function of whether the marine propulsion device 12 is disposed in salt water or fresh water. The electronic current EC is pulsed, in a preferred embodiment, at a duty cycle of approximately 8% when the marine propulsion device is disposed in salt water and at a duty cycle of approximately 0.8% when the marine propulsion device 12 is disposed in fresh water.

The primary goal of the present invention is to perform the steps that inhibit galvanic corrosion from damaging a protected device, such as a marine propulsion device 12. It accomplishes this by decreasing the voltage potential proximate the marine propulsion device 12 below the voltage potential of a second point, such as a sea bed 508 or a sea wall 26 which is connected in electrical communication with a shore ground 22. To accomplish this, the electronic current EC is caused to flow from the shore ground 34 to the boat ground 32 and, as a result, to the protected component. This creates a galvanic circuit in which the protected component, such as the marine propulsion device 12 acts as the cathode of the galvanic circuit while the sea bed 508 and sea wall 26 act as the anode. In place of the sea wall 26, alternative connections to external electrical conductors are also within the scope of the present invention.

Although the present invention has been described in particular detail and illustrated to show a preferred embodiment, it should be understood that alternative embodiments are also within its scope.

I claim:

1. A method for inhibiting corrosion of a component of a marine vessel when an electrical system of the marine vessel is connected in electrical communication with an electrical conductor which is external to said marine vessel, comprising the step of:
   providing a first circuit point which is connectable in electrical communication with a first point of said component;
   providing a second circuit point which is connectable in electrical communication with a second point which is connected in electrical communication with said electrical conductor;
   decreasing the voltage potential of said first point below the voltage potential of said second point by a preselected differential magnitude, said first and second circuit points being connectable to a ground wire of a three wire electrical power cable which is connected in electrical communication between a shore based source of electrical power and said electrical system of said marine vessel, said electrical system being connected in electrical communication with said component of said marine vessel, wherein the floor of the body of water in which the marine vessel is operated acts as an anode and said component acts as a cathode;
   ohmically connecting said first point to boat ground by said ground wire;
   ohmically connecting said second point to shore ground by said ground wire;
   ohmically connecting said component to said ground wire;
   impressing electronic current on said ground wire to induce electronic current flow in said ground wire in a direction of electron flow from shore ground to boat ground.

2. The method of claim 1, wherein:
said first and second points are ohmically bi-directionally connected to each other.

3. The method of claim 2, wherein:
said impressing step is performed periodically and is followed by periods of time when no electronic current flows in a direction from said second point to said first point.

4. The method of claim 1, further comprising:
measuring a voltage potential of a third point which is representative of said voltage potential proximate said first point.

5. The method of claim 4, wherein:
said voltage potential of said third point is measured relative to the voltage potential of said first point.

6. The method of claim 4, wherein:
said component is a marine propulsion device and said third point is located on a transom of a marine vessel on which said marine propulsion device is supported.

7. The method of claim 6, wherein:
said third point is within 12 inches of said marine propulsion device.

8. The method of claim 1, wherein:
said preselected differential magnitude is generally equal to 0.94 volts.

9. The method of claim 2, further comprising:
determining whether said component is disposed in salt water or fresh water.

10. The method of claim 9, further comprising:
selecting a magnitude of said electronic current as a function of whether said component is disposed in salt water or fresh water.

11. The method of claim 10, wherein:
said electronic current is pulsed at a duty cycle of approximately 8% when said component is disposed in salt water.

12. The method of claim 10, wherein:
said electronic current is pulsed at a duty cycle of approximately 0.8% when said component is disposed in fresh water.

13. A method for inhibiting corrosion of a component of a marine vessel when an electrical system of the marine vessel is connected in electrical communication with a source of electrical power which is external to said marine vessel, comprising the step of:
   providing a first circuit point which is connectable in electrical communication with a first point of said component, said component being a marine propulsion device;

providing a second circuit point which is connectable in electrical communication with a second point of said source of electrical power which is external to said marine vessel, said first and second circuit points being connectable to a ground wire of a three wire electrical cable which is connected in electrical communication between a shore based source of electrical power and said electrical system of a marine vessel, said electrical system being connected in electrical communication with said marine propulsion device, wherein the floor of the body of water in which the marine vessel is operated acts as an anode and said marine propulsion device acts as a cathode;

decreasing the voltage potential of said first point below the voltage potential of said second point by a preselected differential magnitude;

ohmically connecting said first point to boat ground by said ground wire;

ohmically connecting said second point to shore ground by said ground wire;

ohmically connecting said component to said ground wire;

impressing electronic current on said ground wire to induce electronic current flow in said ground wire in a direction of electron flow from shore ground to boat ground, said first and second points being ohmically bi-directionally connected to each other.

14. The method of claim 13, wherein:

said decreasing step comprises the step of causing an electronic current to flow in a direction from said second point to said first point, during periods of time which are interspersed by periods of time when no electronic current flows in a direction from said second point to said first point.

15. The method of claim 14, further comprising:

determining whether said marine propulsion device is disposed in salt water or fresh water; and selecting a magnitude of said electronic current as a function of whether said marine propulsion device is disposed in salt water or fresh water.

16. The method of claim 14, further comprising:

measuring a voltage potential of a third point which is representative of said voltage potential proximate said first point, said voltage potential of said third point being measured relative to the voltage potential of said first point.

17. A method for inhibiting corrosion of a marine propulsion device of a marine vessel when an electrical system of the marine vessel is connected in electrical communication with a source of electrical power which is external to said marine vessel, comprising the step of:

providing a first circuit point which is connectable in electrical communication with a first point of said marine propulsion device;

providing a second circuit point which is connectable in electrical communication with a second point of said source of electrical power which is external to said marine vessel, said first and second circuit points being connectable to a ground wire of a three wire electrical cable which is connected in electrical communication between a shore based source of electrical power and an electrical system of a marine vessel, said electrical system being connected in electrical communication with said marine propulsion device, wherein the floor of the body of water in which the marine vessel is operated acts as an anode and said marine propulsion device acts as a cathode;

decreasing the voltage potential of said first point below the voltage potential of said second point by a preselected differential magnitude;

ohmically connecting said first point to boat ground by said ground wire;

ohmically connecting said second point to shore ground by said ground wire;

ohmically connecting said marine propulsion device to said ground wire;

impressing an electronic current on said ground wire to induce electronic current flow in said ground wire in a direction of electron flow from shore ground to boat ground, said first and second points being ohmically bi-directionally connected to each other;

measuring a voltage potential of a third point which is representative of said voltage potential proximate said first point, said voltage potential of said third point being measured relative to the voltage potential of said first point.

18. The method of claim 17, wherein:

said decreasing step comprises the step of causing an electronic current to flow in a direction from said second point to said first point during periods of time which are interspersed by periods of time when no electronic current flows in a direction from said second point to said first point.

19. The method of claim 17, further comprising:

determining whether said marine propulsion device is disposed in salt water or fresh water; and selecting a magnitude of said electronic current as a function of whether said marine propulsion device is disposed in salt water or fresh water.

* * * * *